United States Patent [19]

King et al.

[11] Patent Number: 5,642,375
[45] Date of Patent: Jun. 24, 1997

[54] PASSIVELY-LOCKED EXTERNAL OPTICAL CAVITY

[75] Inventors: David A. King, Palo Alto; Richard J. Pittaro, San Carlos, both of Calif.

[73] Assignee: Hewlett-Packard Company, Palo Alto, Calif.

[21] Appl. No.: 548,787

[22] Filed: Oct. 26, 1995

[51] Int. Cl.$^6$ .................................................. H01S 3/082
[52] U.S. Cl. ............................ 372/97; 372/92; 372/21; 372/33; 372/6; 372/102; 372/99; 372/32
[58] Field of Search ...................... 372/97, 102, 6, 372/33, 32, 20, 19, 99, 92, 18, 21

[56] References Cited

U.S. PATENT DOCUMENTS

| | | | |
|---|---|---|---|
| 3,187,270 | 6/1965 | Kogelnik et al. | 372/97 |
| 3,679,995 | 7/1972 | Sorokin | 372/97 |
| 4,079,339 | 3/1978 | Kobayashi et al. | 372/97 |
| 4,328,468 | 5/1982 | Krawczak et al. | 372/97 |
| 4,550,410 | 10/1985 | Chenausky et al. | 372/97 |
| 4,648,714 | 3/1987 | Benner et al. | 356/301 |
| 4,789,989 | 12/1988 | Stern et al. | 372/6 |
| 4,858,240 | 8/1989 | Poehkler et al. | 372/92 |
| 4,884,276 | 11/1989 | Dixon et al. | 372/21 |
| 4,890,290 | 12/1989 | Hawkins, II | 372/6 |
| 4,907,237 | 3/1990 | Dahmani et al. | 372/32 |
| 5,038,352 | 8/1991 | Lenth et al. | 372/21 |
| 5,097,476 | 3/1992 | Thiessen | 372/92 |
| 5,140,599 | 8/1992 | Trutna, Jr. et al. | 372/102 |
| 5,161,165 | 11/1992 | Zorabedian | 372/102 |
| 5,182,759 | 1/1993 | Anthon et al. | 372/97 |
| 5,432,610 | 7/1995 | King et al. | 356/432 |
| 5,434,874 | 7/1995 | Fouquet et al. | 372/20 |
| 5,437,840 | 8/1995 | King et al. | 356/136 |

OTHER PUBLICATIONS

Bethea; "Megawatt Power at 1.318 m in Nd+3: YAG and Simultaneous Oscillation at Both 1.06 and 1.318>" IEEE Journal of Quantum Electronics,Feb. 1973.

Arimoto, Satoshi et al., "150 mW Fundamental–Transverse–Mode . . . ", *IEEE Journal of Quantum Electronics*, vol. 29, No. 6, Jun. 1993, pp. 1874–1879.

Baev, V.M. et al., "Intra–Cavity Spectroscopy with Diode Lasers", *Applied Physics*, B55, pp. 463–477 (1992).

Buch, Peter et al., "Optically Self–Locked Semiconductor . . . ", *IEEE Journal of Quantum Electronics*, vol. 27, No. 7, Jul. 1991, pp. 1863–1868.

Dahmani, B. et al., "Frequency Stabilization of semiconductor laser . . . ", *Optics Letters*, vol. 12, No. 11 Nov. 1987, pp. 876–878.

Demtröder, Wolfgang, "Laser Spectroscopy", 1982, pp. 390–395.

Dixon, G.J. et al., "432–nm source based on efficient second hamonic generation . . . ", *Optics Letters*, vol. 14, No. 14, Jul. 5, 1989, pp. 731–733.

Eisentein, G. et al., "High Quality antireflection coatings . . . ", *Applied Optics*, vol. 23, No. 1, Jan. 1984, pp. 161–164.

Fleming, Mark W. et al., "Spectral Characteristics of External–Cavity . . . ", *IEEE Journal of Quantum Electronics*, vol. QE–17, No. 1, Jan. 1981, pp. 44–59.

(List continued on next page.)

*Primary Examiner*—Leon Scott, Jr.

[57] ABSTRACT

A laser system capable of providing light of high intensity is disclosed. This system includes a laser gain medium and three reflectors. A first reflector and a second reflector spaced from the first reflector define a laser cavity that contains the laser gain medium. The second reflector has a reflectivity ($R_2$) larger than the reflectivity ($R_1$) of the first reflector such that light emitted from the laser gain medium resonates in the laser cavity. A third reflector having a reflectivity ($R_3$) larger than the reflectivity of the first reflector ($R_1$) is spaced from the second reflector to define a resonant cavity external to the laser cavity. Light passes from the laser cavity to resonate in the external resonant cavity. Part of the light passes from the external resonant cavity to the laser cavity to optically lock the laser gain medium.

22 Claims, 13 Drawing Sheets

OTHER PUBLICATIONS

Hemmerich, A. et al., "Second–Harmonic generation and optical stabilization . . . ", *Optics Letters*, vol. 15, No. 7, Apr. 1, 1990, pp. 372–374.

Henry, C. H., et al., "Locking Range and Stability of Injection . . . ", *IEEE Journal of Quantum Electronics*, vol. QE–21, No. 8, Aug. 1985, pp. 1152–1156.

Iiyama, Koichi et al., "Simple method for measuring the linewidth . . . ", *Optics Letters*, vol. 17, No. 16, Aug. 15, 1992, pp. 1128–1130.

Jerman, J. H. et al., "A miniature Fabry–Perot interferometer . . . ", *Sensors and Actuators A*, 29 (1991), pp. 151–158.

Kean, P. N. et al., "Efficient sum–frequency upconversion . . . ", *Optics Letters*, vol. 17, No. 2, Jan. 15, 1992, pp. 127–129.

Kozlovsky, W. J. et al., "Blue light generation by resonator–enhanced frequency . . . ", *Appl. Physics Lett.*, 65 (5), Aug. 1, 1994, pp. 525–527, *Electronics Letters*, vol. 25, No. 1, Jan. 5, 1989, pp. 27–28.

Lyu, Gap–Youl et al., "A novel method of measuring linewidth . . . ", *Optics Communications*, vol. 98, No. 4,5,6, May 1, 1993, pp. 281–284.

Parke, R. et al., "2.0 W CW, Diffraction–Limited Operation . . . ", *IEEE Photonics Technology Letters*, vol. 5, No. 3, Mar. 1993, pp. 297–300.

Polzik, E. S. et al., "Frequency doubling with $KNbO_3$ in an external cavity", *Optics Letters*, vol. 16, No. 18, Sep. 15, 1991, pp. 1400–1402.

Rong–Qing, H. et al., "Improved Rate Equations for External Cavity . . . ", *IEEE Journal of Quantum Electronics*, vol. 25, No. 6, Jun. 1989, pp. 1580–1584.

Schmidt, E. et al., "Evaporative Coatings", *Photonics Spectra*, May 1995, pp. 126–128.

Simonsen, H., "Frequency Noise Reduction of Visible InGaAlP Laser . . . ", *IEEE Journal of Quantum Electronics*, vol. 29, No. 3, Mar. 1993, pp. 877–884.

Tanner, C. et al., "Atomic beam collimation . . . ", *Optics Letters*, vol. 13, No. 5, May 1988, pp. 357–359.

Temkin, H. et al., "Reflection Noise in Index–Guided InGaAsP Lasers", *IEEE Journal of Quantum Electronics*, vol. QE–22, No. 2, Feb. 1986, pp. 286–293.

Tkach, R. W. et al., "Regimes of Feedback Effects in 1.5–µm . . . ", *Journal of Lightwave Technology*, vol. LT–4, No. 11, Nov. 1986, pp. 1655–1661.

Ueno, Yoshiyasu et al., "30–mW 690–nm High–Power Strained Quantum–Well . . . ", *IEEE Journal of Quantum Electronics*, vol. 29, No. 6, Jun. 1993, pp. 1851–1856.

Wieman, C. et al., "Using diode lasers for atomic physics", *Rev. Sci. Instrum.*, vol. 62, No. 1, Jan. 1991, pp. 1–20.

Wigley, P.G. et al., "High–Power 467 nm Passively–Locked Signal–Resonant . . . ", *Center for Research in Electro–Optics and Lasers (CREOL)*, University of Central Florida, Orlando, FL.

Wyatt, R. et al., "10 kHz Linewidth 1.5 µm InGaAsP . . . ", *Electronics Letters*, vol. 19, No. 3, Feb. 3, 1983, pp. 110–112.

Yan, G.–Y. et al., "Measurement of diode laser characteristic . . . ", *Optical Society of America*, vol. 9, No. 11, Nov. 1992, pp. 2122–2127.

Zorabedian, P., "Axial–Mode Instability in Tunable External–Cavity . . . ", *IEEE Journal of Quantum Electronics*, vol. 30, No. 7, Jul. 1994, pp. 1542–1552.

PASSIVELY-LOCKED EXTERNAL OPTICAL CAVITY

FIELD OF THE INVENTION

This invention relates to optical systems for the generation of laser radiation. More particularly, this invention relates to a diode-pumped, passively-locked laser with a linear optical cavity.

BACKGROUND

In many laser applications (for example, chemical sensing), high-intensity laser light is needed. One way to provide high-intensity light is using light trapped inside an optical cavity. An optical cavity or resonator consists of two or more mirrored surfaces arranged so that incident light may be trapped, bouncing back and forth between the mirrors. In this way, the light inside the cavity may be many orders of magnitude more intense than the incident light.

In many applications, the optical gain medium (such as a helium neon discharge tube) is within the optical cavity. For a typical diode laser, the cavity mirrors are deposited directly on the diode gain medium itself. For some applications, however, such as frequency-tuning and linewidth-narrowing, one or both of the diode's facets is antireflection-coated and the diode is operated inside an optical cavity defined by mirrors external to the diode. While a diode gain media may be operated inside such a cavity, the low damage threshold of the diode's emission facet severely limits the amount of power build-up in the cavity.

To overcome this limitation while still generating a large optical field, the diode laser may be placed outside of a separate high-finesse optical cavity in which the diode laser radiation is trapped. This separate cavity is referred to hereinafter as a "build-up" cavity. Diode lasers, however, emit radiation with an optical bandwidth that is much larger than that of a high-finesse build-up cavity. To achieve substantial amplification of diode laser radiation in a build-up cavity the diode laser must be forced to emit coherent radiation with a bandwidth that approaches or matches that of the cavity at a cavity resonant frequency. This process is hereinafter called "optical locking."

One way to reduce the bandwidth of diode lasers is to use all-electronic frequency-locking of diode lasers. This technique, however, requires very fast servos, a large degree of optical isolation of the diode laser from the cavity, and sophisticated electronic control.

As an alternative, substantial linewidth reduction can be achieved with optical feedback (i.e., passive) schemes. For example, Dahmani et al., in "Frequency stabilization of semi-conductor lasers by resonant optical feedback," Opt. Lett., 12, pp. 876–878 (1987), reported passive optical locking of a diode laser to a build-up cavity. In this technique, light from a diode laser is directed into a build-up cavity. If the light has a frequency matched to a cavity resonance frequency, the light is trapped. A portion of the trapped light is then directed back into the diode laser to act as a passive feedback mechanism, which locks the frequency of the low-finesse diode laser to that of the high-finesse build-up cavity, as well as reduces the diode emission bandwidth.

A shortcoming of systems similar to that of Dahmani et al. is that such systems employ weak optical locking: only a very minute portion of the light in the build-up cavity is fed back to the diode laser. The disadvantage of the weak optical locking technique is that it still requires careful electro-mechanical control of both the magnitude and phase of the light fed back to the diode laser. Additionally, such systems contain at least four reflectors.

Passive all-optical locking of antireflection-coated diode lasers to external resonant cavities has recently been exploited extensively. Examples include frequency doubling (W. Lenth and W. P. Risk in U.S. Pat. No. 5,038,352, "Laser system and method using a nonlinear crystal resonator," August 1991; W. J. Kozlovsky et al., "Blue light generation by resonator-enhanced frequency doubling of an extended-cavity diode laser," August 1994, vol. 65(5), pp. 525–527, Appl. Phys. Lett.), frequency mixing (P. G. Wigley, Q. Zhang, E. Miesak, and G. J. Dixon, "High power 467 nm passively-locked signal-resonant sum frequency laser," Post Deadline Paper CPD21-1, Conference on Lasers and Electro-optics, Baltimore, Md., Optical Society of America, 1995), and chemical sensing (David A. King, et al., in U.S. Pat. No. 5,432,610, "Diode-pumped power build-up cavity for chemical sensing," July, 1995). King et al., (supra and incorporated by reference in its entirety herein) describe several embodiments in which a diode laser is optically locked to an external resonant cavity. King et al. teach that there is a broad restriction on the diode current and additional components may be required to eliminate off-resonance reflections for a system containing three reflective elements.

To illustrate the difficulty of passive all-optical locking of diode laser, a brief description of the physics of an optical cavity is given in the following. As depicted in FIG. 1, two reflective surfaces 2 and 4 (with reflectivities (reflection coefficients) $R_1$ and $R_2$ respectively) define a cavity 6. This cavity 6 has a comb of resonant frequencies where the comb spacing is c/2L (c is the speed of light in the cavity and L is the optical distance between the two reflective surfaces 2 and 4).

Light incident on a linear cavity generally undergoes one of two possible phenomena as depicted in FIG. 1. In FIG. 1A, the frequency of the incident light 8 is far from a cavity resonance frequency. Thus, the incident light 8 is simply reflected as reflected light 10 by surface 2. FIG. 1B depicts the situation when the incident light 8 is at (or very near) a cavity resonant frequency. In this case, the incident light is trapped as an intracavity beam 12 between surfaces 2 and 4. The trapped light additionally leaks through surfaces 2 and 4, affecting the reflected beam 10 and the transmitted beam 14 from the cavity respectively. The leakage is out of phase with the incident beam 8, thus causing a destructive interference with the portion of beam 10 that is simply and non-resonantly reflected from surface 2.

When the incident beam 8 is at a cavity resonant frequency, the effective reflectivity (reflection coefficient) of the cavity 6 is lower than the simple nonresonant reflectivity (or reflection coefficient) of surface 2. This effect is shown in FIG. 1C, in which the reflectivity of the cavity ($I_{ref}/I_{inc}$) shown in FIG. 1A and FIG. 1B is plotted as a function of normalized frequency. The frequency is normalized to a comb spacing of the cavity such that a cavity resonance occurs for each integral value of normalized frequency. The cavity bandwidth is the full width at half maximum of each resonance and becomes smaller as the reflectivities of surfaces 2 and 4 decrease. When $R_1$ equals $R_2$, the magnitude of the resonant and nonresonant reflections from surface 2 are equal and their phases differ by 180°. In this way, the cavity reflectivity drops to zero (in the absence of scattering) on a cavity resonance.

The goal of all-optical locking of a diode laser to a cavity is to generate intracavity beam 12 with incident beam 8 from the diode laser. This imposes desirable optical properties (for example, bandwidth and frequency) that originate from the cavity on the diode laser. The reflected beam 10 from the cavity is used to frequency-lock the diode laser to a cavity resonance. However, FIG. 1C shows that the reflected beam 10 is the weakest at a cavity resonance. Thus, it appears that, by optical feedback, as the diode current is increased, the laser tends to reach threshold at a frequency other than a cavity resonance frequency. Therefore, it has long been believed by those skilled in the art that the structure shown in FIG. 1A is highly unsuitable for frequency-locking of a diode laser.

Various approaches have been used to reduce the destructive interference mentioned above and to ensure that the most intense reflection back into the diode laser originates uniquely from the optical cavity. A simple approach is to use additional cavity reflectors or reflections that allows spatial isolation of the resonant feedback (Dahmani et al., "Frequency stabilization of semiconductor lasers by resonant optical feedback," supra). Other solutions rely on using very small feedback into the diode laser from mirror-induced birefringence (C. E. Tanner, et al., "Atomic beam collimation using a laser diode with a self locking power-build-up cavity," May 1988, vol. 13 (5), pp. 357–359, Optics Letters) or very weakly excited counter-propagating modes (A. Hemmerich et al., "Second-harmonic generation and optical stabilization of a diode laser in an external ring resonator," April 1990, Vol. 15 (7), pp. 372–374, Optics Letters). All these solutions require additional components that tend to increase the complexity and expense of constructing the laser system. What is needed is a passively locked laser with relatively simple structure and yet capable of generating high-intensity light.

SUMMARY

The present invention provides a laser system that has a first resonant cavity and a second resonant cavity having a common reflector between them. These resonant cavities are defined herein respectively as the "laser cavity" and the "external resonant cavity" (or simply the "external cavity"). Typically, the laser build-up system contains three reflectors: a first reflector having a reflectivity ($R_1$), a second reflector spaced from the first reflector to define the laser cavity, and a third reflector spaced from the second reflector to define the external cavity. The second reflector has a reflectivity ($R_2$) larger than the reflectivity ($R_1$) of the first reflector. The third reflector also has a reflectivity $R_3$ larger than the reflectivity of the first reflector ($R_1$). A laser gain medium is contained in the laser cavity to emit light to resonate in the laser cavity. Light passes from the laser cavity to resonate in the external resonant cavity. Part of the light passes from the external resonant cavity back into the laser cavity to optically lock the laser gain medium.

Using such a system, a method for producing a high-intensity laser light is provided. In this method, light emitted from the laser gain medium resonates in the laser cavity and enters the external resonant cavity, resonating therein to reach high intensity. Part of the resonant light in the external resonant cavity is transmitted through the second reflector back to the laser cavity to optically lock the laser gain medium to a resonant frequency of the external resonant cavity by strong optical feedback.

In contrast to prior art external cavity diode lasers, in the present invention, the reflectivity of the second reflector ($R_2$) is not made to be smaller than that of the first reflector ($R_1$). Due to the selection of the relative values of $R_1$, $R_2$, and $R_3$, the frequency bandwidth of the laser cavity is larger than that of the external cavity. In this laser build-up system, the narrow-bandwidth external cavity dominates the laser gain medium by optical feedback. In this way, all-optical passive locking (without the need of electromechanical components to adjust the spatial relationship of optical elements or optical phase) of the laser gain medium to the external cavity can be achieved. Unlike conventional passive-locking laser systems, in the present invention, stable operation is achievable with a sizeable amount of resonance feedback to lock the laser gain medium to the resonant frequency of the external cavity. This is referred to as "strong feedback" passive locking. With such strong feedback passive locking, unlike conventional systems, as previously stated, no additional electromechanical mechanism is needed to control the phase and magnitude of light fed back to the laser gain medium.

However, unlike conventional laser build-up systems using relatively large feedback locking (such as Lenth and Risk or Kozlovsky), which require additional optical elements (such as mirrors) to facilitate stability, the present laser build-up system requires no such additional elements for added stability. It is common knowledge that additional optical elements require alignment and complicate the manufacturing process, as well as increase the cost for components.

Furthermore, in the present invention, because the laser gain medium is not located inside the external cavity, a very high-intensity (power) light can be present in the external cavity without causing damage to the laser gain medium. The high reflectivity of the reflectors enables light to be reflected in multiple passes in the external cavity, thereby allowing a narrow bandwidth without requiring a long cavity length. With this invention, a high-intensity laser light source can be made with a theoretical minimum number of components (including optical elements, such as reflectors, and electromechanical elements to fine-tune the position of the optical elements). The intensity in the external resonant cavity can be one or more orders of magnitude higher than that of the laser cavity and can be 10 to $10^5$ as high as that emitted by the gain medium. Additionally, the narrow bandwidth external cavity has a temporal averaging effect on the diode emission, minimizing fast fluctuations (the external cavity can be thought of as an optical capacitor). Therefore, the present invention is uniquely suitable to provide a compact high-intensity light source.

The high-intensity light made available in the laser build-up system or method of the present invention has a variety of applications. Examples include but are not limited to the following: (1) diode laser mode cleanup—where a well characterized output beam is required from one or more solid state sources; (2) chemical sensing (e.g., as described by King et at., supra, and U.S. Pat. No. 5,437,840 (King et al.)); particle counting; nonlinear frequency generation (e.g., using a nonlinear medium inside the external cavity); environmental sensing; and distance measurement.

BRIEF DESCRIPTION OF THE DRAWING

The following figures, which show the embodiments of the present invention, are included to better illustrate the present invention. In these figures, like numerals represent like features in the several views.

DETAILED DESCRIPTION OF PREFERRED EMBODIMENTS

In the present invention, a second reflective surface (or reflector) having a relatively large reflectivity is disposed between a first reflective surface (or reflector) and a third reflective surface (or reflector) to define a laser cavity (which contains a laser gain medium) and an external cavity. Light resonates in, and passes back from, the external cavity to provide feedback to passively lock the laser gain medium at the resonant frequency of the external cavity.

Figure 2:
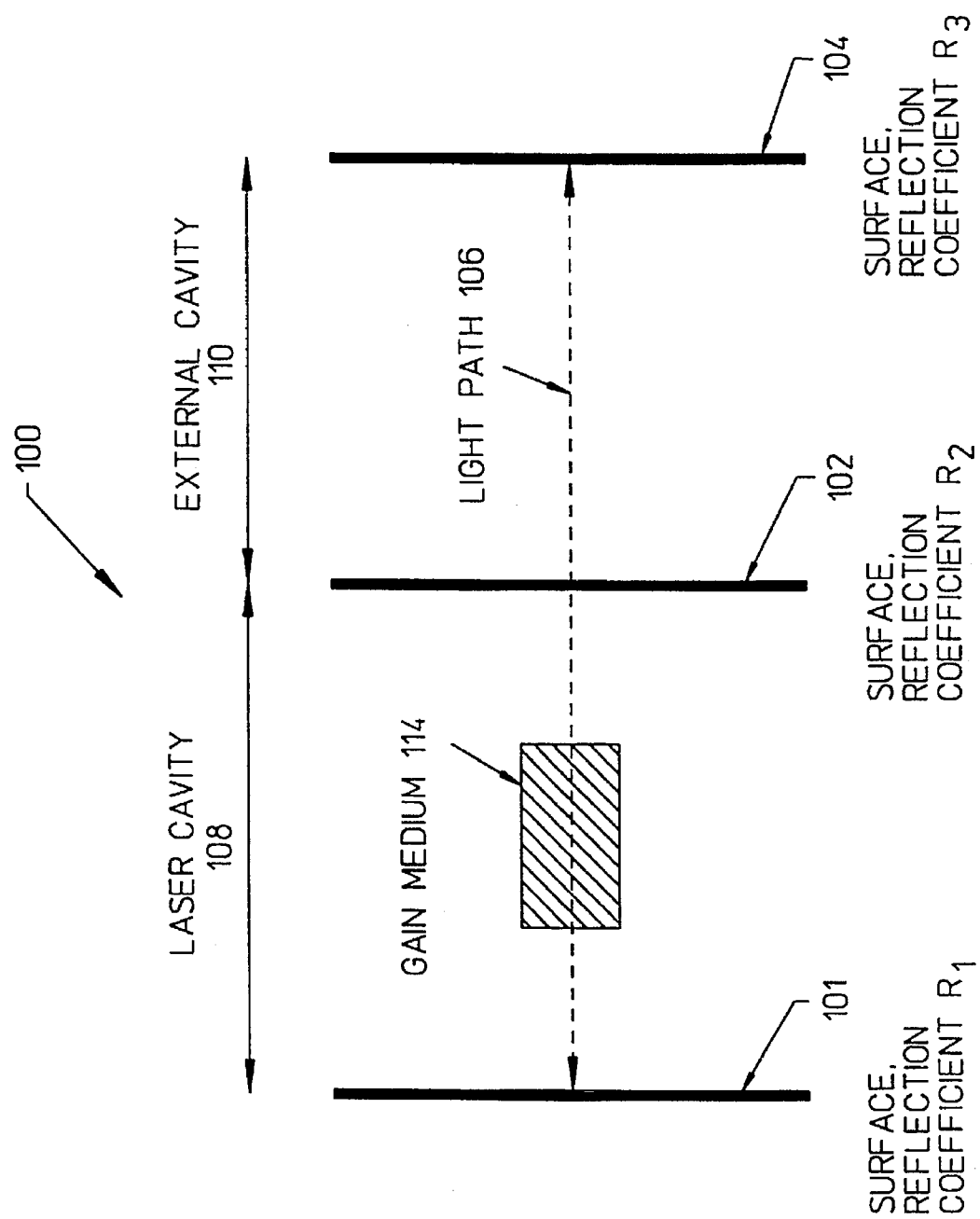
FIG. 2 is a schematic representation of an embodiment of the laser system of the present invention.

A first preferred embodiment of the laser build-up system is shown in FIG. 2. Three reflective surfaces (or reflectors) 101, 102, and 104 are arranged in the laser system 100 so that light may travel between them on a straight light path (represented by axis or line 106). The reflectivities of the three surfaces 101, 102, and 104 are $R_1$, $R_2$, and $R_3$, respectively. A laser cavity, 108 (in this case a two-mirror optical cavity) is defined between reflective surfaces (or reflectors) 101 and 102. Reflective surfaces 102 and 104 define another two-mirror cavity, the external cavity 106. An optical gain medium 114 is disposed in the laser cavity 108 in such a way that it amplifies light traveling along axis 106 without introducing any substantial additional reflection. This can be done by antireflection-coating the facets of the gain medium 114 to eliminate reflection. One alterative way to avoid reflection from the gain medium is to chamfer its facet(s). When the values of $R_1$, $R_2$, and $R_3$ are chosen according to the invention, and the gain medium exhibits an optical nonlinearity, then above laser threshold the light in both cavities 108 and 110 has the same optical properties (e.g. frequency and bandwidth). The optical properties of the light in the laser cavity 108 are determined by the light in the external cavity 110.

A significant portion of the light incident on the external cavity 110 passes back into the laser cavity 108 through the reflective surface 102 to optically lock the gain medium. Depending on the application and the amount of light leaving the external cavity (e.g., through the reflective surface 104), the amount of light returning to optically lock the gain medium can vary. Generally, this amount is about 3% to about 90%; and preferably, because of optical limitations of commonly available optical elements, about 10% to about 50%. Thus, this results in strong optical feedback for all-optical, passive locking of the gain medium to the resonant frequency of the external cavity. A suitable gain medium has adequate nonlinearity such that it can be optically locked to the external cavity with strong optical feedback. Although, because of its large nonlinearity, diode laser is the preferred gain medium, other nonlinear gain media, such as titanium-doped sapphire, organic material, and the like, can be used.

The bandwidth of an optical cavity is determined by the reflectivities of the cavity mirrors. In this invention the reflectivities $R_2$ and $R_3$ are chosen to be much higher than reflectivity $R_1$. With such reflectivities, the bandwidth of the external cavity 110 is several orders of magnitude smaller than the bandwidth of the laser cavity 108. The laser cavity length and the external cavity length are the optical distances between surfaces 101 and 102 and between surfaces 102 and 104, respectively.

In this invention, the value of $R_1$ is generally about 0.1 to about 0.99, $R_2$ is about 0.9 to about 0.999999, and $R_3$ is about 0.9 to about 0.999999. For some applications, such as chemical analysis (e.g., similar to the technique used in King et al, U.S. Pat. No. 5,432,610), preferably, to provide higher intensity light in the external cavity, $R_1$ is about 0.1 to about 0.99, $R_2$ is about 0.995 to about 0.999999, and $R_3$ is about 0.995 to about 0.999999. For some other applications, such as intracavity nonlinear generation of light, the preferable values are between 0.1 and 0.99 for $R_1$, between 0.9 and 0.999999 for $R_2$, and between 0.9 and 0.999999 for $R_3$. In addition, to have stronger optical feedback, it is preferable that $R_1$ is less than $R_2$, which is preferably less than $R_3$ (i.e., $R_1 < R_2 < R_3$). However, the optically-locked system will still function if $R_2$ is larger than or equal to $R_3$. In practice (using real components), $R_2$ and $R_3$ may be equal yet the reflectivity of the cavity is nonzero due to scattering loss of light.

In conventional external cavity diode lasers (ECL) (such as those described by Jens Buus, *Single frequency semiconductor lasers*, SPIE Optical Engineering Press, Bellingham, Wash., 1991, Section 8.2) surfaces 101 and 102 are the facets of a diode laser. It is well known that, for stable operation, the reflectivity $R_2$ is made to be as small as possible—orders of magnitude less than $R_1$ (P. Zorabedian, "Axial-mode instability in tunable external-cavity semiconductor lasers," July 1994, vol. 30 (7), pp. 1542–1552, IEEE Journal of Quantum Electronics). It is also well known that when $R_3$ is large and $R_2$ approaches $R_1$ the system shown in FIG. 2 will enter the coherence collapse regime (J. Buus, supra) and operation becomes unstable. Instability is marked by a dissimilarity of optical (phase) properties of the light in the two cavities 108 and 110 and usually results in linewidth broadening. Under conditions of higher feedback (e.g., more than 10%) the diode laser operates stably only if the emission facet is antireflection-coated (R. W. Tkach, and A. R. Chraplyvy, "Regimes of feedback effects in 1.5 μm distributed feedback lasers," November, 1986, vol. LT-14 (11), pp. 1655–1661, Journal of Lightwave Technology). When such a emission facet is antireflection-coated, the laser system is, in effect, a two mirror laser system.

However, surprisingly, in the two cavity laser system of the present invention, stable operation is achieved when $R_2$ is much larger than $R_1$ (i.e., its corresponding transmission is orders of magnitude larger than that of $R_1$). In fact, by choosing the reflectivities $R_1$, $R_2$, and $R_3$ according to this invention, an entirely new operating regime is reached. Moreover, the performance of this device is much better than that of a conventional ECL because the linewidth can be much narrower in a more compact design and the beam shape is the more desirable lowest order Hermite-Gaussian mode $TEM_{00}$. Stable operation is accomplished in the present invention by judiciously selecting the reflectivities of the reflective surfaces in the laser build-up system.

In this invention, two resonant cavities (laser cavity and external cavity) are separated by a common reflective surface, e.g., surface 102. The reflectivity $R_1$ is much smaller than $R_2$ and $R_3$. It is well known that the bandwidth of a simple two-mirror cavity depends on the mirror reflectivities—the higher the reflectivities, the smaller the bandwidth. Thus, the bandwidth of the laser cavity 108 is much larger than that of the external cavity 110. Under broad-band illumination, the circulating electric field in the laser cavity 108 can be viewed as the sum of two components; one with a large bandwidth (originating in the laser cavity) and the other with a small bandwidth (originating in the external cavity 110 and leaking through mirror 102). For the light in the laser cavity 108 to have the same optical properties as the light in the external cavity 110, the narrow bandwidth component must dominate as the gain of the gain medium 114 is increased towards laser threshold.

Figure 1A:
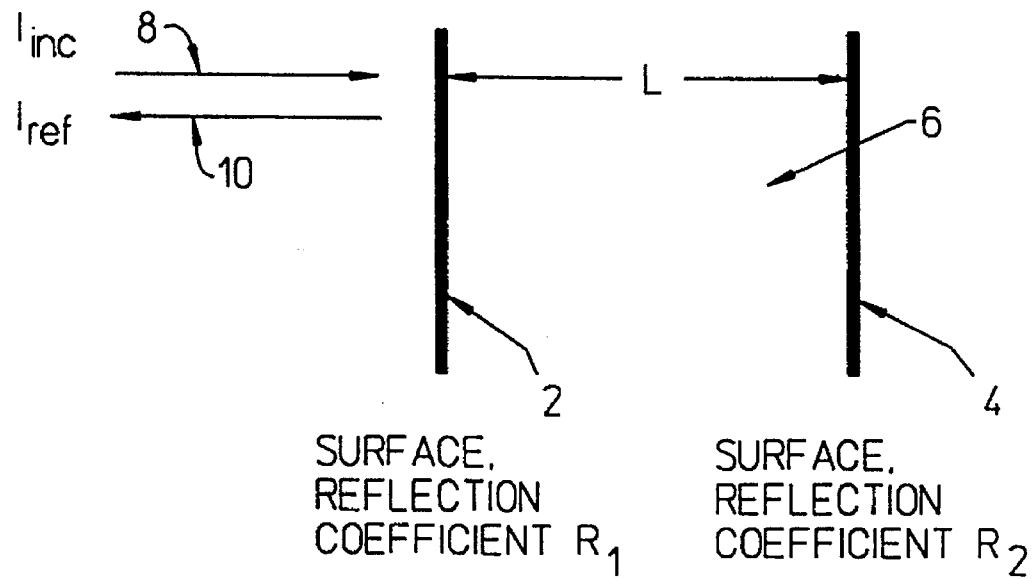
FIG. 1A is a schematic representation of light incident on an optical cavity without resonance.
Figure 1B:
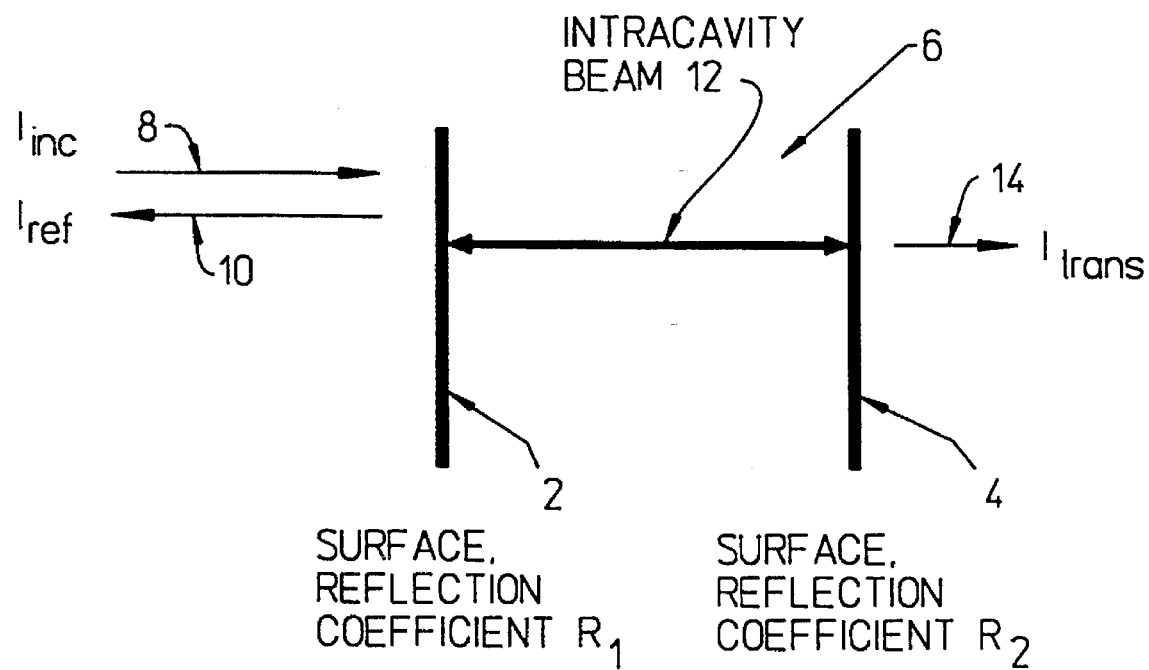
FIG. 1B is a schematic representation of light incident on an optical cavity with resonance.
Figure 1C:
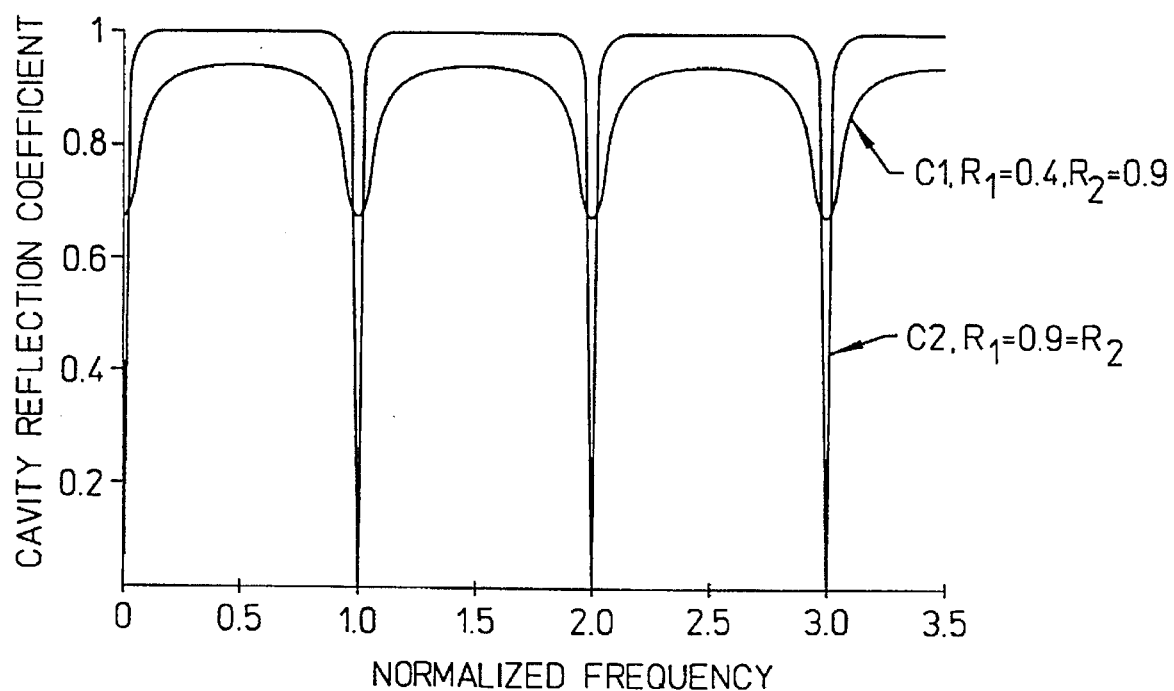
FIG. 1C is a graphical representation of cavity reflection related to normalized frequency showing the effect of reflectivities of the reflectors in an optical cavity.

FIG. 1C shows that for a cavity with $R_1=0.4$ and $R_2=0.9$ (curve C1) the reflectivity of a cavity at a cavity resonance may be 60% that of the front mirror (having a reflectivity of $R_1$). Curve C2 shows the reflectivity for a cavity with $R_1=R_2$. For a system as shown in FIG. 2, where $R_1=0.85$, $R_2=0.99936$, and $R_3=0.99999$, the reflectivity of the external cavity 110 at the cavity resonance can be calculated to be 94% that of the front mirror ($R_2$). However, for laser cavity length 5 cm and external cavity length 9 cm, the external cavity bandwidth is almost 280 times smaller than that of the laser cavity. It is known that the threshold inversion density for laser action is inversely proportional to the cavity bandwidth (A. E. Siegman, *Lasers*, University Science Books, Mill Valley, Calif., 1986, p. 511). The light with the narrow-bandwidth from the external cavity will reach lasing threshold at a lower optical gain than the broad-bandwidth laser cavity component. Thus, the gain medium will be dominated by the feedback from the external cavity 110 rather than the simple reflection from surface 102. Although the above theory is believed to be correct, the operation and construction of the laser systems of the present invention is practicable and do not depend on any particular theory.

Figure 3:
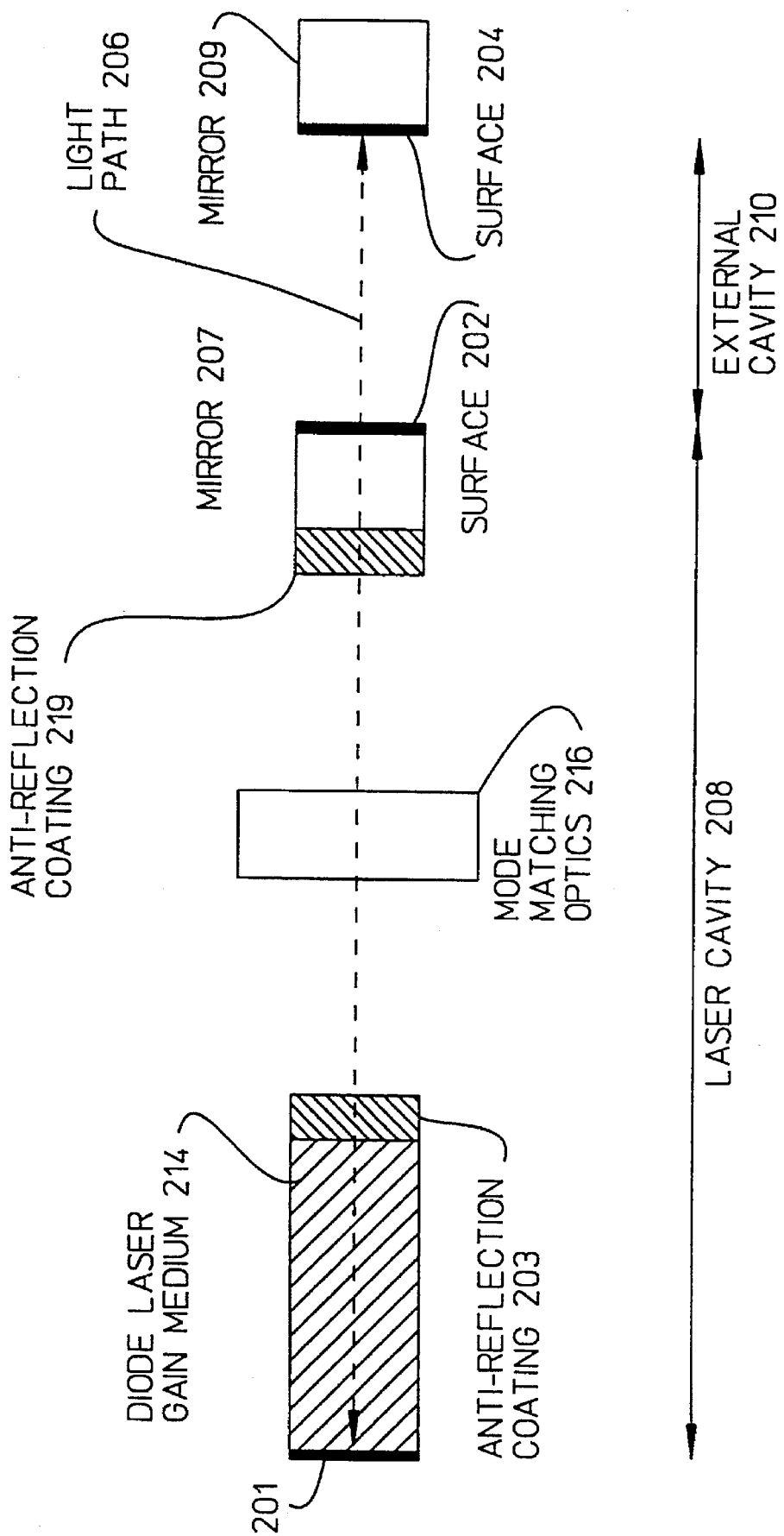
FIG. 3 is a schematic representation of another embodiment of laser system of the present invention, having a mode-matching device.

FIG. 3 shows another preferred embodiment. Here, the gain medium is incorporated into the structure of a semiconductor diode laser 214. The back facet of the laser is coated to be reflective and forms surface 201. The emission facet 203 of the diode laser is antireflection (AR) coated, with reflectivity preferably in the range of less than $10^{-3}$. Reflective surfaces 202 and 204 are coated onto mirrors (substrates) 207 and 209, respectively. These surfaces have appropriate curvatures to support a stable spatial mode in external cavity 210 (between surfaces 202 and 204). Mode-matching optics 216 (e.g., lenses and/or prisms) well known to those skilled in the art can be used to spatially match the diode emission into the external cavity 210. The surface 219 of mirror (substrate) 207 facing the laser cavity 208 is preferably antireflection-coated with a reflectivity in the range about 0.04 to 0.001. Alternatively, the surface 219 can be a chamfer at an angle with the light path 206 to reduce its light reflection into the gain medium.

As an example, such a system can be constructed using a Philips CQL801D diode laser as the gain medium 214 having emission facet 203 coated to have a reflectivity within the range of $10^{-5}$ to $10^{-4}$. The mirror 207 and 209 (having surfaces with reflectivities $R_2=R_3=0.99999$) can be obtained from Research Electro-optics, Boulder, Colo. The radius of curvature of each of the surfaces 202 and 204 forming the external cavity is 5 cm. The mode-matching optics consists of an AR-coated gradient index lens (GRIN lens) with a 0.23 pitch and a 5 cm focal length mode-matching lens. The external cavity length is 2 cm and the laser cavity length is 4 cm. With a diode current of about 70 mA (obtained from a 9 V transistor battery) stable continuous wave (CW) operation with about 145 W total power generated in the external cavity in a $TEM_{00}$ mode was obtained in such a system.

The optimum value of $R_2$ depends on a trade-off between the desired power in the external cavity and the feedback (or the system stability) to the gain medium. For example, if the optical loss of the mode-matching optics (or any other optical component in the laser cavity) is large and surface 203 is not perfectly antireflection-coated, to achieve stable system performance in the high feedback regime, more light must leak from the external cavity into the laser cavity. This can be accomplished by reducing the value of $R_2$ while keeping the value of $R_3$ constant (see FIG. 1C). However, at the same time the power in the external cavity will decrease. In practice, the optimum value of $R_2$ depends on the optical loss and the degree of mode match.

Figure 4A:
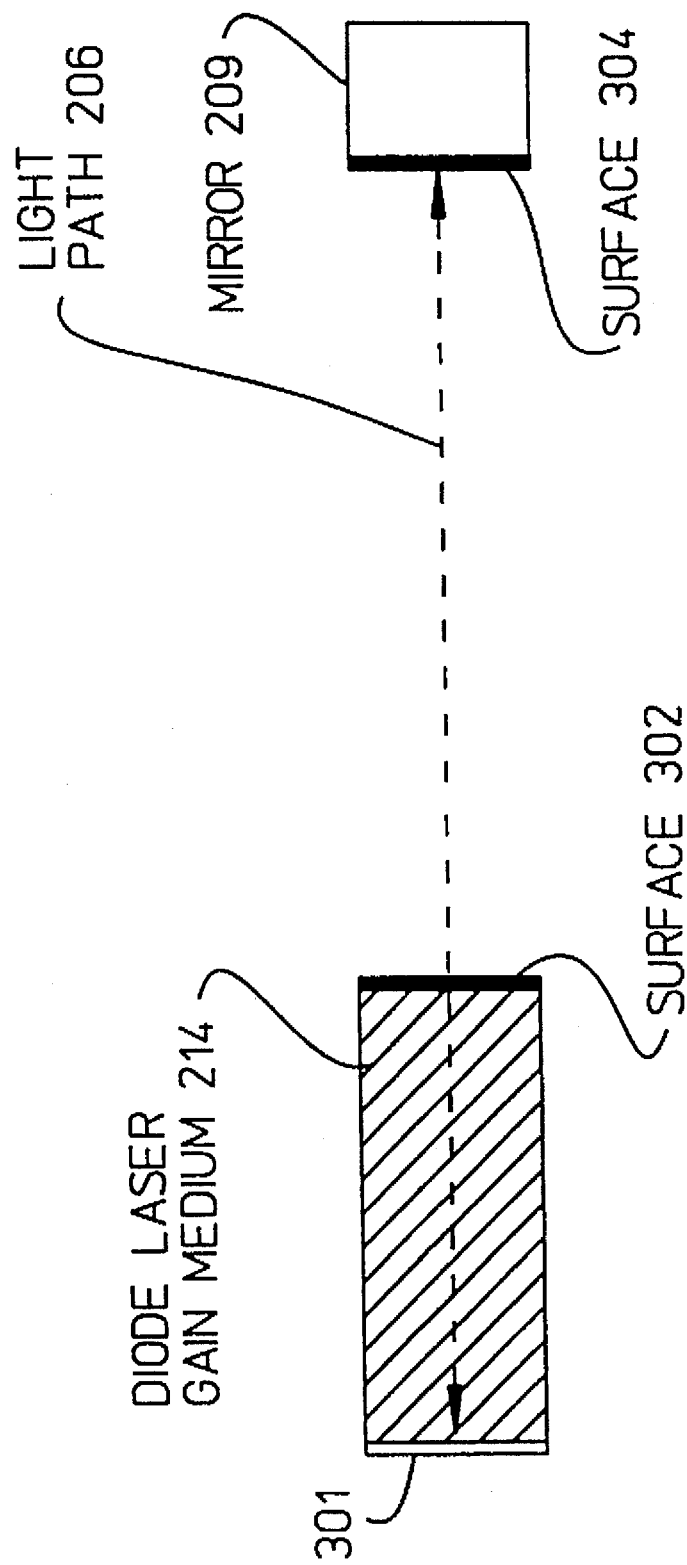
FIG. 4A is a schematic representation of yet another embodiment of the laser system of the present invention, wherein the reflecting surfaces of the laser cavity is on the gain medium.

In another embodiment (FIG. 4A), both reflective surfaces of the laser cavity can be put onto a gain medium (preferably a diode laser). Surface 301 and highly reflective surface 302 are formed respectively by the rear and emission facets of the diode laser to result in a three-reflector (i.e., reflective surfaces 301, 302, 304) system. Reflective surface 304 may be deposited on a mirror substrate 309. Again, the curvature of surfaces 301, 302, and 304 should be chosen to support a stable cavity mode in a manner well known to those skilled in the art. A suitable technique for forming such reflective surfaces consists of depositing a dielectric stack mirror onto a substrate, and transferring the stack to the emission facet (E. Schmidt et al., "Evaporative coatings," May 1995, pp. 126–128, Photonics Spectra).

Figure 4B:
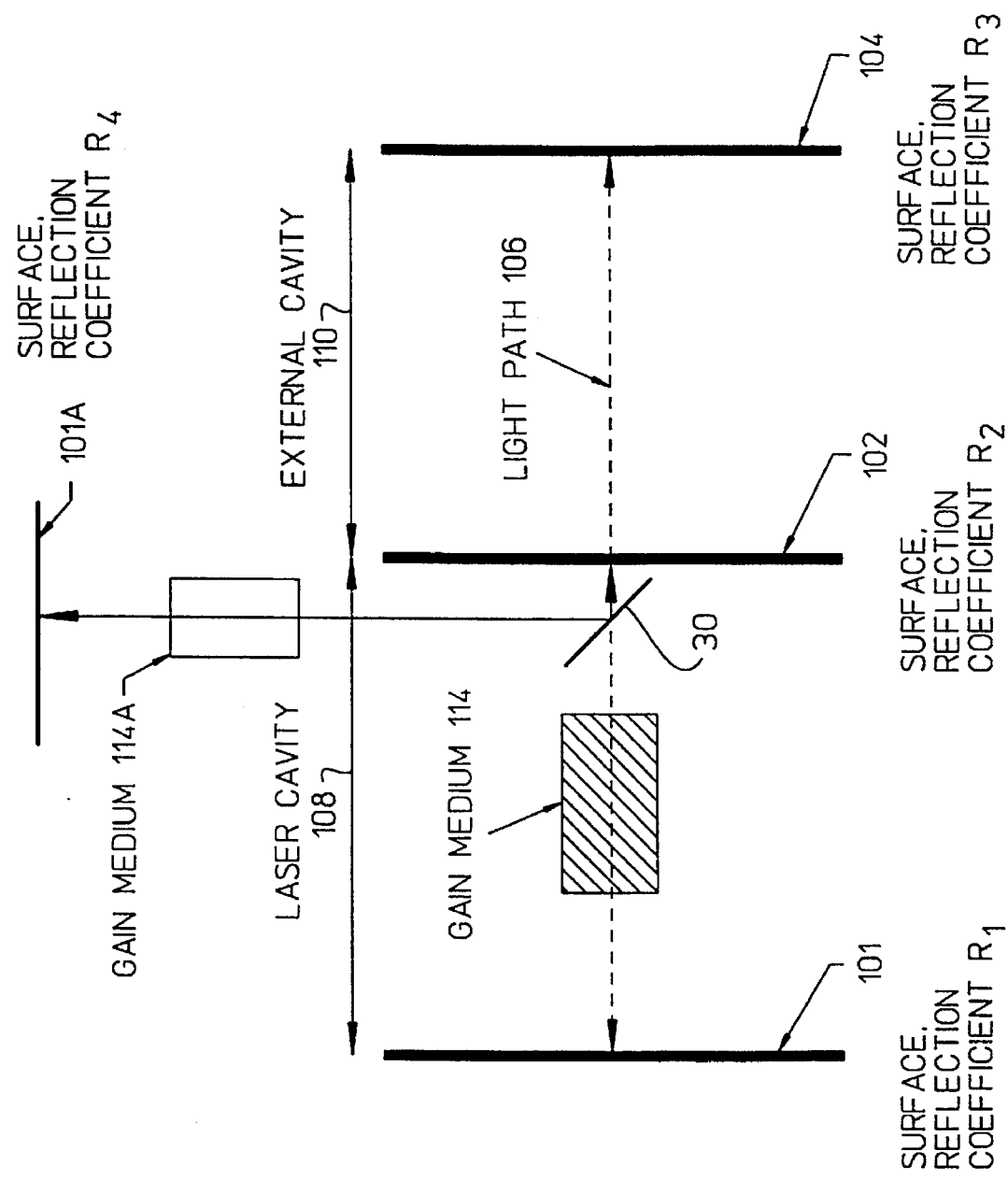
FIG. 4B is a schematic representation of an embodiment of the laser system of the present invention that has more than one gain medium.

FIG. 4B shows an embodiment in which more than one gain medium is optically locked to the external cavity at the same time, as long as the additional gain medium or media exhibit a nonlinearity. In FIG. 4B, a system similar to that of FIG. 2, an additional gain medium 114A is contained in a second laser cavity 108A, which is defined between reflective surface 101A having a reflectivity $R_4$ and reflective surface 102 via beam splitter 103. $R_4$ can, but need not, be the same as $R_1$, as long as it functions in an analogous manner to result in resonance and light input into the external resonant cavity 110. Likewise, the additional gain medium 114A and the additional laser cavity 108A can but need not have the same bandwidth as the first gain medium 114 and the first laser cavity 108. In fact, gain medium 114A and laser cavity 108A can resonate at a frequency different from that of gain medium 114 and laser cavity 108. The advantage of optically locking more than one gain medium to the external cavity is that more power or additional frequencies may be trapped in the external cavity. Additional gain media could be added in the same manner. Beam splitter 103 can be a polarization beam splitter. In another related example, a diode array can replace the diode gain medium 214 in a system similar to that of FIG. 3.

Limiting the Resonant Frequencies

Figure 5:
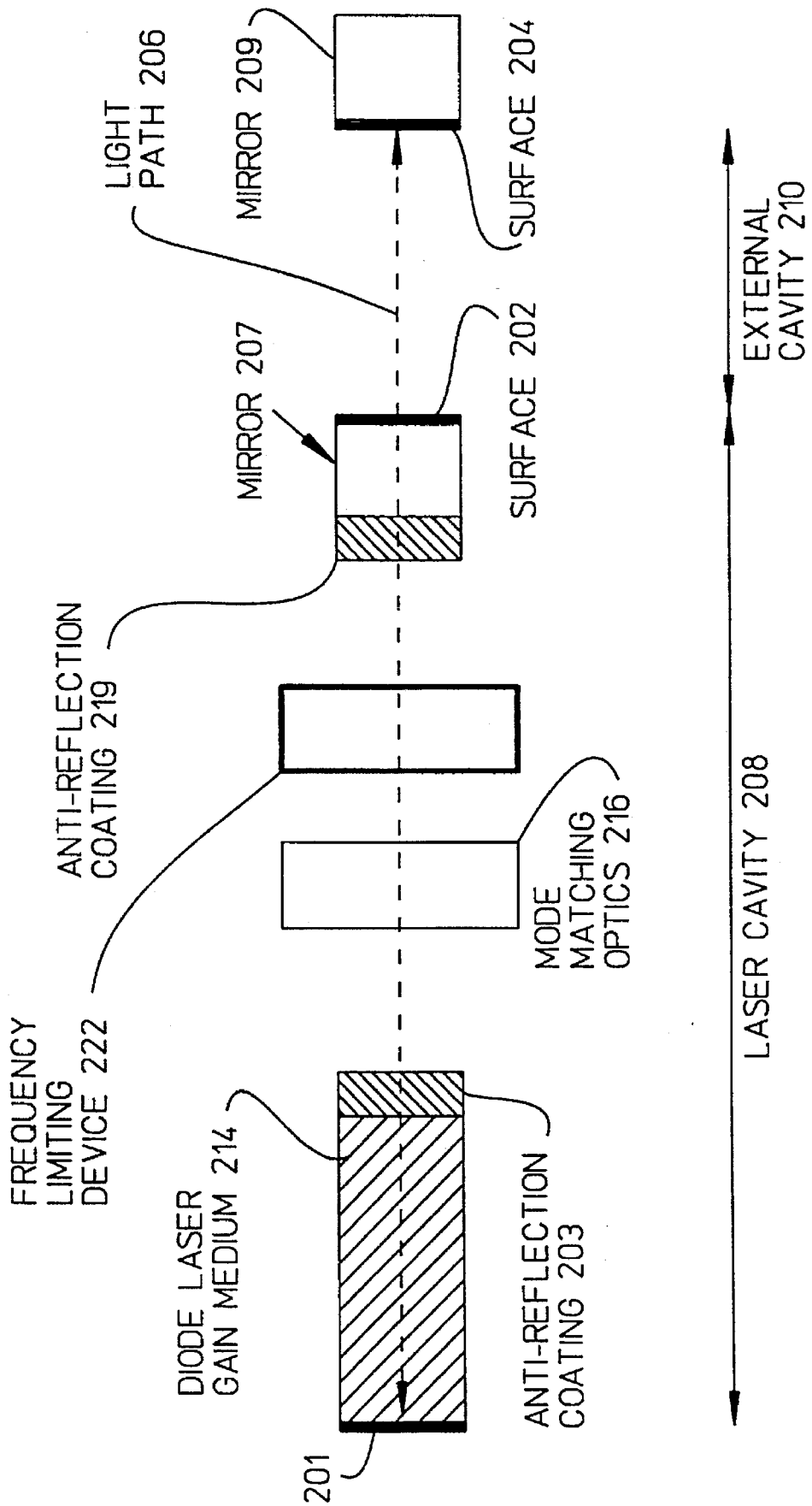
FIG. 5 is a schematic representation of yet another embodiment of the laser system of the present invention with a frequency-limiting device.

An example of a preferred embodiment having a frequency-limiting device is shown in FIG. 5. In general, the gain medium has an amplification bandwidth that spans many cavity resonant frequencies. In an optical-feedback laser system, the gain medium may frequency-lock to any one of the external cavity resonant frequencies. For example, typical InGaAlP diode lasers have a gain bandwidth of approximately 10 THz centered about 670 nm, and the external cavity resonant frequency spacing is 1.5 GHz when the external cavity length is 10 cm. This means that the system may lock to any of more than 6,000 possible frequencies. In some applications, such as particle-counting, this frequency range is acceptable, while for other applications, such as some chemical (e.g., spectral) analysis, nonlinear frequency conversion, or distance measurement, the number of possible locking frequencies must be limited (in some cases to fewer than ten). In these instances a frequency-limiting device can be employed to filter out the undesirable frequencies. Examples of such devices are described in detail by King et al. (supra). These devices may include one or a combination of gratings, etalon, lyot filters, or dielectric stack filters. King et al. also describe how the rear surface of a diode laser gain medium may be coated with a distributed Bragg reflector, which also limits the allowed frequencies of the system.

As shown in FIG. 5, a frequency-limiting device 222 is placed between mode-matching optics 216 and mirror 207 in a system similar to that of FIG. 3. In this way, the frequency-limiting device 222 produces the most effect using a minimum number of components. Such a system has been constructed using a Philips CQL801D diode laser as gain medium 214, having its emission facet coated to have a reflectivity in the range of $10^{-5}$ to $10^{-4}$. The mode-matching optics 216 consisted of an antireflection-coated (AR-coated) lens with a numerical aperture (NA) of 0.48 and focal length of 4.8 mm, an anamorphic prism pair (3:1), and a 25 cm focal length lens. Surfaces 202 and 204 had a 17 cm radius of curvature, with $R_2$=0.9999 and $R_3$=0.99999. The length of the external cavity 210 was 10 cm.

Figure 6:
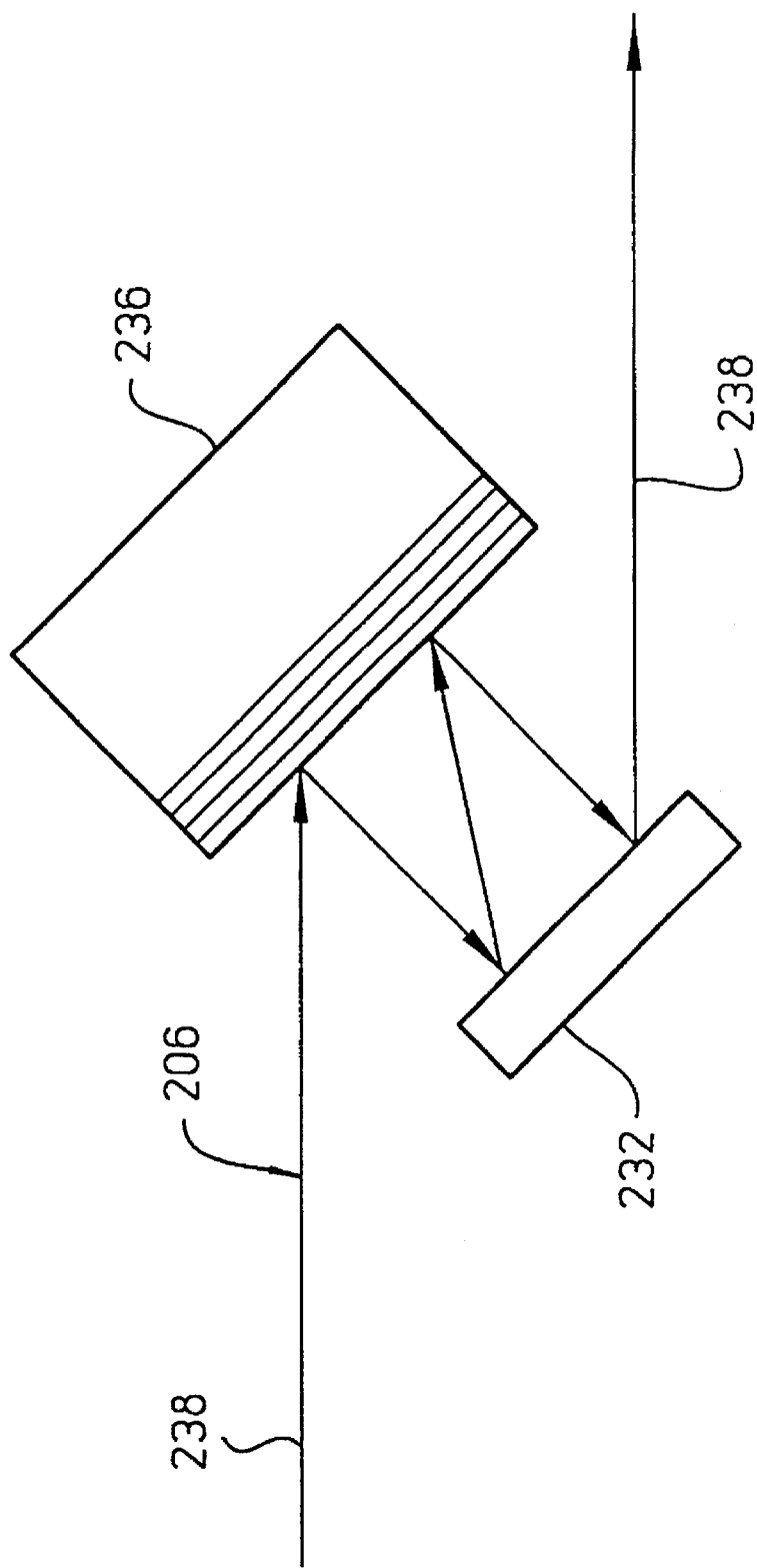
FIG. 6 is a schematic representation of an embodiment of a frequency-limiting device applicable in the present invention.

The frequency-limiting device 222 for this example is depicted in FIG. 6. It consisted of a metalized mirror, 232, and a 1800 g/mm diffraction grating (Zeiss) 236, arranged so that the mirror 232 provided a second pass of the optical beam along the light path 238 on the diffraction grating, doubling the effective dispersion. The same components could be used to bounce light a large number of times from the grating, thus decreasing the total system bandwidth. Alternatively, one bounce on the diffraction grating could also be employed. In this system, with a diode current of 65 mA about 230 W, light was generated in the external cavity with stable system performance.

Another preferred frequency-limiting device is an ultranarrow-band transmission filter based on very low loss dielectric stack mirrors spaced by a half-wavelength-thick layer (Research Electro-optics, Boulder, Colo). A filter deposited on a 1 inch (2.54 cm) substrate was used in a system similar to that of FIG. 5. The filter had a transmission of about 80% and a bandwidth of 0.08 nm. This filter was operated in a system consisting of an AR-coated Toshiba 9225 diode laser 214. The mode-matching optics 216 consists of an AR-coated lens with NA=0.48 and focal length 4.8 mm; a 3:1 cylindrical galilean telescope (focal lengths +38.1 mm and −12.7 mm); and a 12.5 cm spherical lens 216, with an ultranarrow-band transmission filter as the frequency-limiting device 222. Mirrors 207 and 209 from Research Electro-optics each has a radius of curvature of 10 cm. The external cavity length was 8 cm. The reflectivity $R_3$ of surface 204 was about 0.99999. Different values of $R_2$ (the reflectivity of surface 202) were employed. The results are tabulated in Table 1.

TABLE 1

| $R_2$ | diode current (mA) | power (W) in external cavity, about |
|---|---|---|
| 0.99936 | 72 | 60 |
| 0.99966 | 78 | 70 |
| 0.99980 | 69 | 100 |

The advantage of using an ultranarrow-band transmission filter as the frequency-limiting device 222 is that all the components may be aligned along a single straight axis 206. In another embodiment the ultranarrow-band transmission filter may be deposited directly onto mirror 207 in place of the antireflection coating 219.

In some applications it is preferable that only one or a few external cavity modes may lase (i.e. resonate). To this end, one can impose an additional restriction on the ratio of the laser cavity and external cavity lengths. When operation is restricted by the bandwidth of the gain medium or the frequency-limiting device 222 to only a few modes, the power stability depends on the effective locking range of the gain medium. In the case of a diode laser, the locking is in part due to the interaction between gain and phase (since wavelength is determined by the external cavity) as well as effective reflectivity of the external cavity (C. H. Henry, et al., "Locking range and stability of injection locked 1.54 μm InGaAsP semiconductor lasers," August 1985, vol. QE-21 (8), pp. 1152–1156, IEEE Journal of Quantum Electronics). For both the external and laser cavities to be resonant at the same wavelength, the optical-path length in each cavity has to be an integral number of half wavelengths. The diode laser may adjust its phase delay to match this condition by altering the saturated gain (C. H. Henry et al., supra).

It can be shown mathematically that for stable build-up in the laser cavity (and hence frequency-locking) to occur the electric field appears in the laser cavity with different phase delays at different external-cavity resonant frequencies. The ratio, r, of the laser-cavity and external-cavity lengths can be expressed as r=n+a/b, where n is an integer, whereas a and b are real numbers. If a=0, the ratio r is integral. Then the electric field at all the external-cavity resonant frequencies occurs with the same phase delay, repeating every 2π. The diode laser has an initial phase delay that may be different from that of the electric field at any of the cavity resonant frequencies. In this case, to remain locked to the external cavity, the maximum amount in phase (i.e., gain) the diode laser has to adjust is ±π. On the other hand, if a=1 and b=3 and the diode cavity is restricted to lase over only three modes (e.g., by the frequency-limiting device 222), then the maximum phase adjustment can be shown to be ±π/3.

Without a frequency-limiting device, the diode laser may simply lase at a different cavity resonant frequency in order to acquire the additional phase delay.

Figure 7:
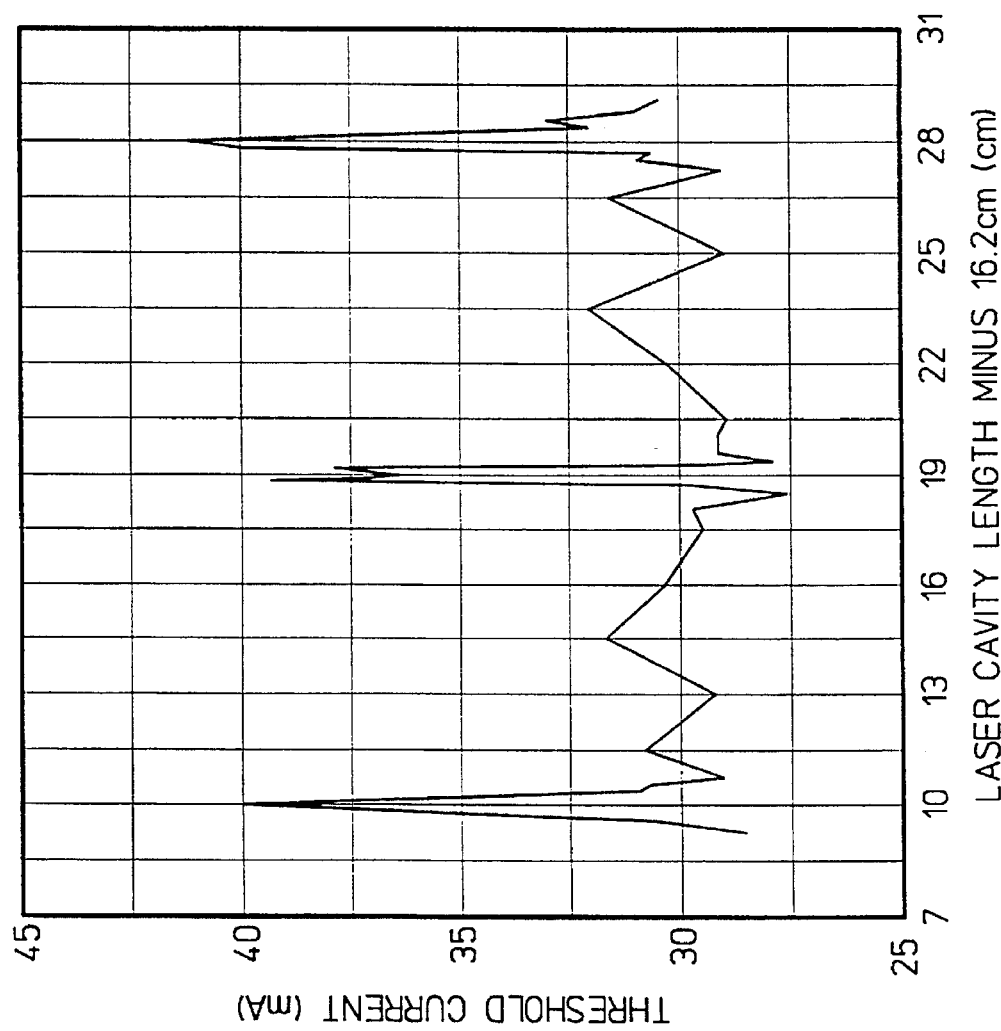
FIG. 7 is a graphical representation of the threshold current of the gain medium relating to laser-cavity length and external-cavity length with a frequency-limiting device.

When the diode laser is restricted to only a few modes, locking instability may occur if the diode cannot adjust the phase delay far enough. The nonlinearity responsible for a gain-dependent phase differs between diode lasers. In cases when the nonlinearity is small, a small adjustment of the phase shift is preferable over a large one to maintain stable locking. This effect is shown in FIG. 7 where a system of FIG. 5 was used. The gain medium 214 was a Hitachi 6714G laser and the frequency-limiting device was an ultranarrow-band transmission filter. The threshold current (a measure of the saturated gain) is larger whenever the laser cavity length is an integral multiple of the external cavity length (9 cm). In embodiments where the gain medium exhibits a limited locking range (or limited nonlinearity) a nonintegral ratio of external cavity length to laser cavity length is preferred. Preferable, the ratio of b/a is large, more preferably greater than 3.

To make a compact device with a laser build-up cavity of the present invention, the first, second, and third reflective surfaces can be made by machining (such as micromachining) of a substrate (e.g., silicon, silicon dioxide, and the like) and coating with a suitable dielectric (or another suitable reflecting material) to obtain the selected reflectivity at the desired positions. In this way, the laser cavity and the external resonant cavity can be formed at the proper positions. Standard machining techniques, including micromachining and microlithographic techniques can be used. For example, Jerman et al. ("A miniature Fabry-Perot interferometer with a corrugated silicon diaphragm support," Sensors and Actuators, 29, 151 (1991)) describe how to micromachine a two mirror cavity. This technique can be used to make the laser cavity and the external resonant cavity of a three-mirror system in accordance with the present invention. Furthermore, it is contemplated that other optical components, such as mode-matching devices, can also be formed by such machining techniques. Forming the optical elements on a substrate (preferably as a unitary, integral unit) obviates the need for securing means such as adhesive, nuts and bolts, screws, clamps, and the like, as well as reduces alignment and movement problems.

Applications

The present invention can be used advantageously in many applications. Examples include nonlinear frequency conversion and distance measurement. Once a suitable laser is provided (e.g., by the present invention), such operations can be done with skill known in the art. Intracavity frequency conversion has been described by several authors: for frequency doubling, by E. S. Polzik and H. J. Kimble, "Frequency doubling with KNbO$_3$ in an external cavity," September 15, vol. 16 (18), Optics Letters, W. Lenth and W. P. Risk (supra), W. J. Kozlovsky et al. (Supra), and A. Hemmerich et al. (Supra),; and for nonlinear mixing, by P. G. Wigley et al. (Supra), and P. N. Kean and G. J. Dixon, "Efficient sum-frequency upconversion in a resonantly pumped Nd:YAG laser," January 15, vol. 17 (2), Optics Letters.

Figure 8:
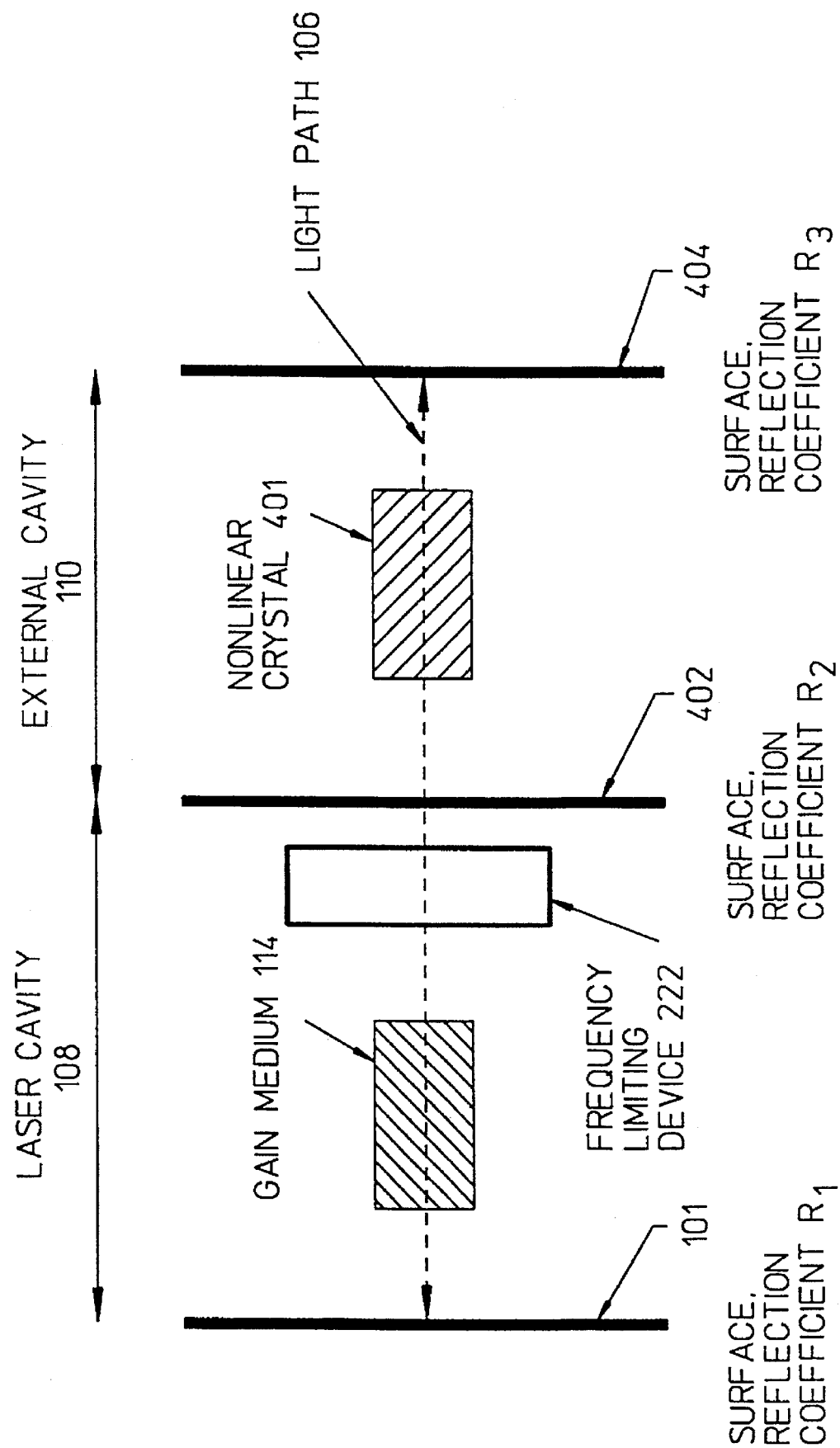
FIG. 8 is a schematic representation of yet another embodiment of the laser system of the present invention, showing a nonlinear crystal in the external cavity.

FIG. 8 shows an illustrative schematic view of a system that can be used to generate optical frequencies other than the frequency supplied by the gain medium 204. A nonlinear crystal 401 is placed inside the external cavity 110 in a setup similar to that of FIG. 2. The nonlinear crystal converts the light from the gain medium 114 to light of other frequencies. The reflective surfaces 402 and 404 replace surfaces 102 and 104 of FIG. 2. Surfaces 402 and 404, in addition to having the same reflectivity ranges as surface 102 and 104 (taking into account the additional optical loss associated with the passage of light through the crystal), may be reflective at any of the frequencies of the light that is nonlinearly generated. One or more crystals may be necessary to complete the nonlinear conversion. If needed, several crystals may be placed in the external cavity 110. In some cases, a frequency-limiting device 222 may be used, such as when the nonlinear frequency conversion occurs over a narrow frequency range and there is no other mechanism to restrict frequency.

Figure 9:
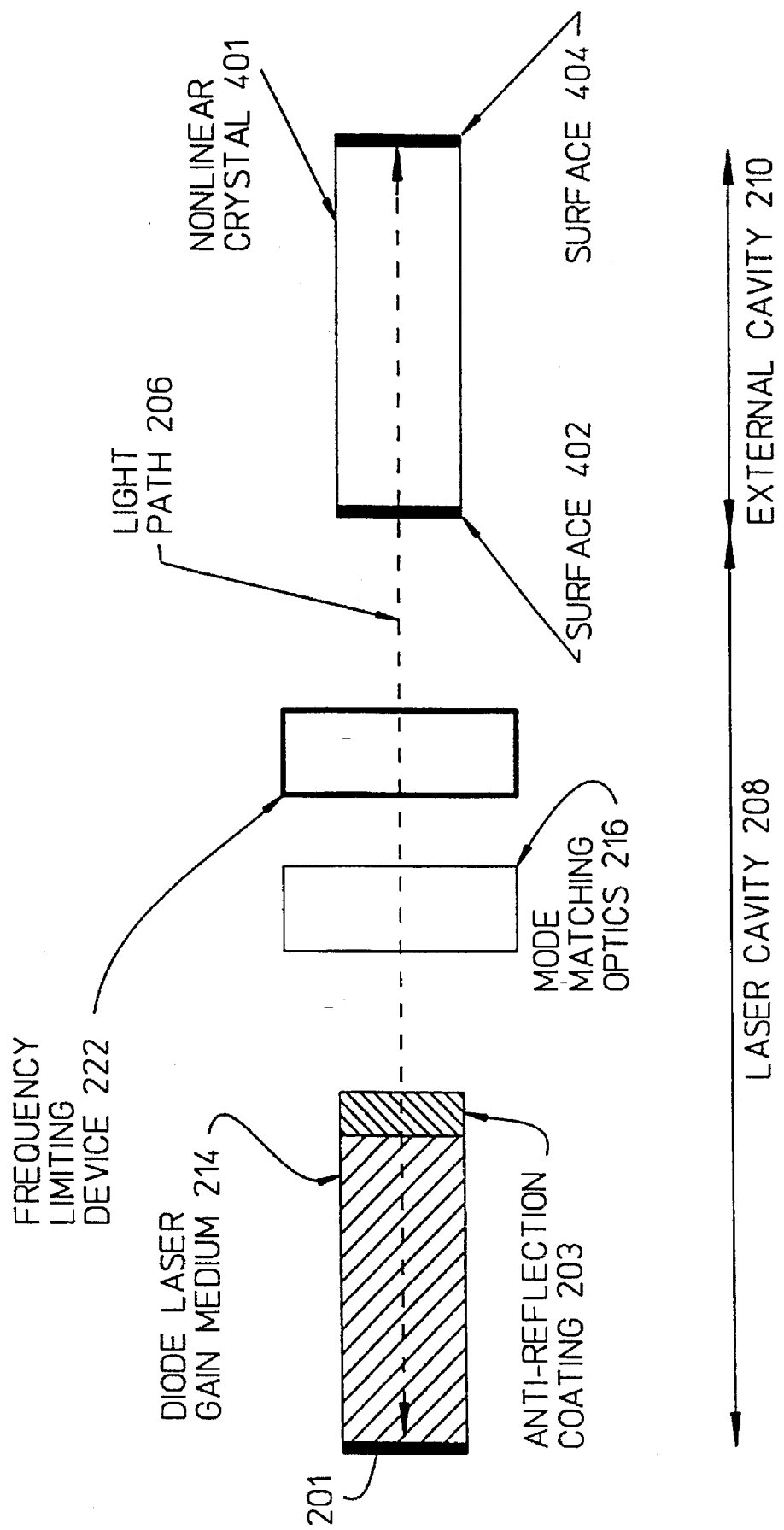
FIG. 9 is a schematic representation of yet another embodiment of the laser system of the present invention, showing nonlinear crystal with reflective surfaces formed thereon.

In FIG. 8, the crystal surfaces exposed to the light in the light path, 106 is preferably antireflection-coated to minimize the bandwidth of the external cavity, thereby improving the frequency-locking of the external cavity to the laser cavity. An alternative, simpler embodiment is shown in FIG. 9, wherein the reflective surfaces 402 and 404 are directly deposited onto the surfaces of the crystal 401. FIG. 9 shows that a diode laser 214 is used as the optical source. Mode-matching optics 216, and a frequency-limiting device 222, may also be used for optimal operation.

Figure 10:
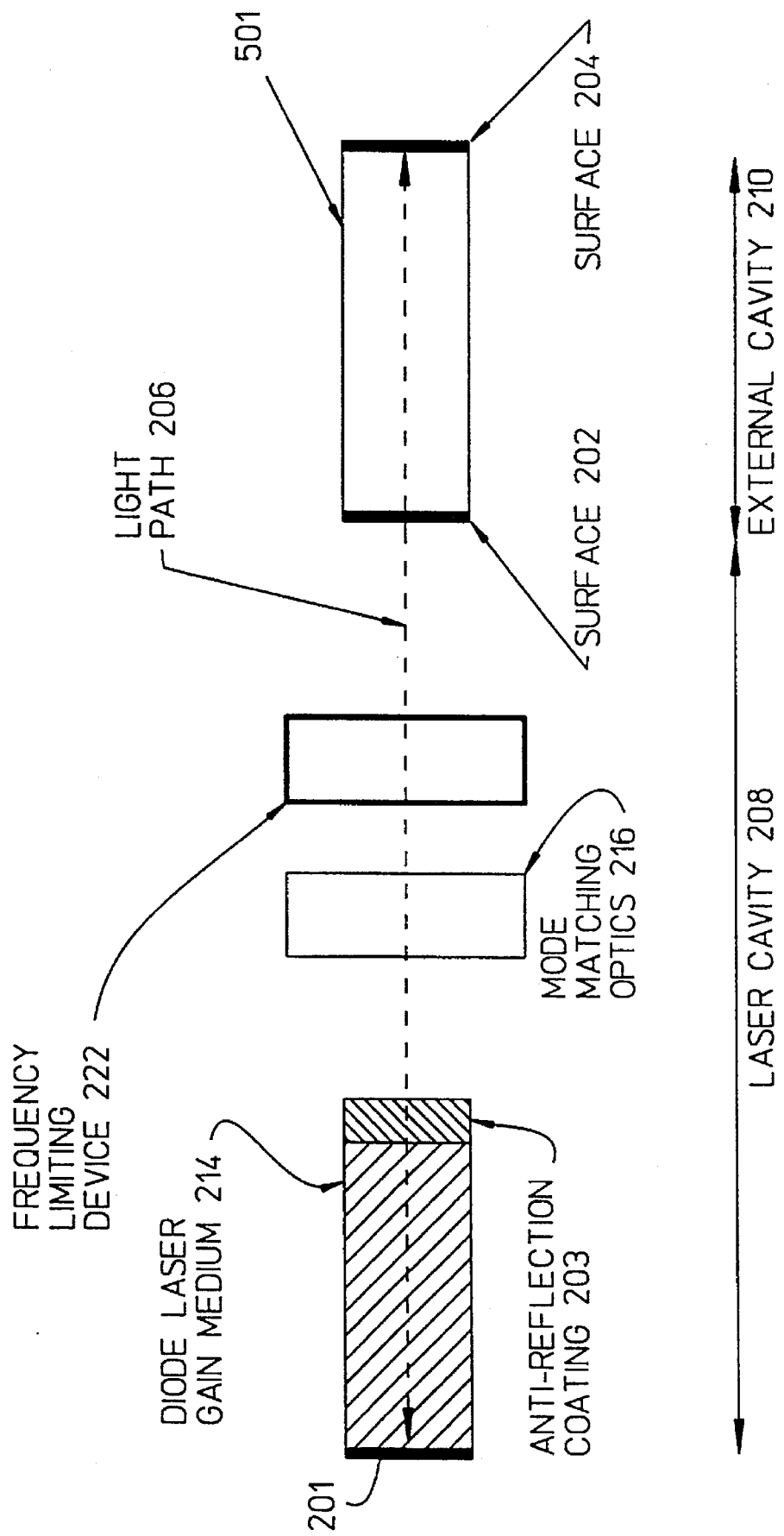
FIG. 10 is a schematic representation of yet another embodiment of the laser system of the present invention, wherein the reflective surfaces are deposited on a solid support.

Optical distance measurement requires a source that generates a stable narrow bandwidth beam. A suitable source is an embodiment of the present invention (e.g., one shown in FIG. 10). In this embodiment, the reflective surfaces 202 and 204 are deposited onto a solid piece of optically transparent support material 501. Suitable support materials have very low thermal expansion coefficients, e.g., zerodur or fused silica. To increase the thermal stability, the solid support 501 can be thermally controlled (as is currently performed in commercial helium neon laser based distance meters). Means for thermally controlling are well known in the art.

Figure 11:
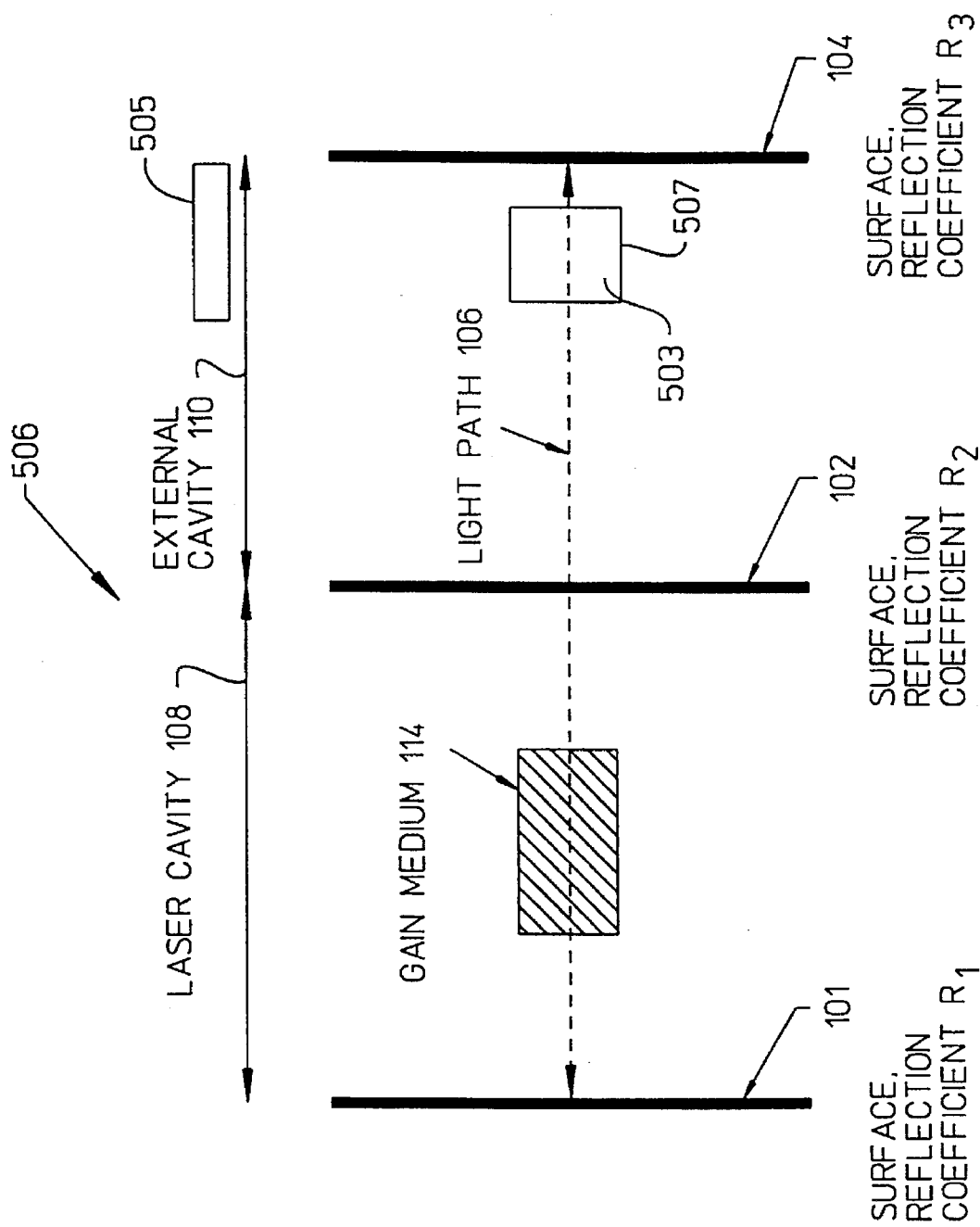
FIG. 11 is a schematic representation of an embodiment of the laser system of the present invention, showing a sample being analyzed and a detector for detecting light interaction by the sample.

As previously stated, the light made available with the present passively locked external cavity (especially high intensity light) is effective for use in chemical sensing (analysis). For example, in FIG. 11, which shows a laser system 506, a sample 503 containing target analytes can be placed in the beam path 106 in the external resonant cavity 110 to cause light interaction (e.g., light absorption, light scattering, Raman scattering, fluorescence, indirect fluorescence, phosphorescence, and the like). A detector 505 can be positioned adjacent to the sample 503 to sense the light interaction, thereby providing analytical data on the analytes in the sample 503. The sample can be placed in the beam path by means of a container 507 that does not substantially absorb or reflect light of the desired frequency (or frequencies). Alternatively, the reflective surfaces 102, 104 can be part of the structure (e.g., the container) that confines the sample. Another example is depositing the sample on the side of the reflective surface 104 exterior to the external resonant cavity 110 such that the light interaction is caused by evanescent excitation.

Although the illustrative embodiments of the device of the present invention and the method of using the device have been described in detail, it is to be understood that the above-described embodiments can be modified by one skilled in the art, especially in sizes and shapes and combination of various described features, without departing from the spirit and scope of the invention. For example, various features disclosed in this application can be combined.

What is claimed is:

1. A laser system comprising:

(a) an optically nonlinear laser gain medium;

(b) a first reflector having a reflectivity ($R_1$) and a second reflector spaced from the first reflector to define a laser cavity containing the laser gain medium, the second reflector having a reflectivity ($R_2$) larger than the reflectivity ($R_1$) of the first reflector; and (c) a third reflector having a reflectivity ($R_3$) larger than the reflectivity of the first reflector ($R_1$), spaced from the second reflector to define therewith a resonant cavity external to the laser cavity, said reflectivities of said reflectors resulting in light passing from the laser cavity to resonate in the external resonant cavity and light passing from the external resonant cavity to the laser cavity to passively optically lock said cavities by means of the nonlinearity of the laser gain medium; thereby producing more power in the external cavity than in the laser cavity.

2. The system of claim 1 wherein the laser gain medium is a laser diode which is caused to lock to a resonant frequency of the external resonant cavity by strong optical feedback to the laser diode from the external resonant cavity.

3. The system of claim 1 wherein the laser gain medium is a laser diode which is caused to lock to a resonant frequency of the external resonant cavity by optical feedback to the laser diode of more than 10% of the light transmitted from the laser diode to the external resonant cavity.

4. The system of claim 1 wherein the light intensity in the external resonant cavity is at least one order of magnitude larger than that in the laser cavity.

5. The system of claim 1 wherein $R_1$ is from 0.99 to 0.1, $R_2$ is from 0.9 to 0.999999, and $R_3$ is from 0.9 to 0.999999.

6. The system of claim 1 wherein $R_1$ is from 0.99 to 0.1, $R_2$ is from 0.995 to 0.999999, and $R_3$ is from 0.995 to 0.999999.

7. The system of claim 1 further comprising a frequency-limiting device between the laser gain medium and the external resonant cavity to limit the range of frequency emitted into the external resonant cavity.

8. The system of claim 7 wherein the ratio (r) of the length of the laser cavity to that of the external resonant cavity is (n+a/b), wherein n, a, and b are positive integers and n has a value of 0 or larger, a has a value of 0 or larger, and b has a value of 1 or larger.

9. The system of claim 8 wherein r is a noninteger.

10. The system of claim 7 wherein the frequency-limiting device is a ultra-narrow-band-transmission filter.

11. The system of claim 7 wherein the frequency-limiting device is a grating system.

12. The system of claim 1 wherein $R_3$ is larger than $R_2$ which is larger than $R_1$.

13. The system of claim 1 further comprising a nonlinear optical element disposed between the second reflector and the third reflector to convert light from the laser gain medium to light of a different frequency.

14. The system of claim 1 wherein the laser gain medium has an antireflection-coated facet spaced from and facing the second reflector.

15. The system of claim 1 wherein the laser gain medium has two antireflection-coated facets spaced from the first and second reflectors.

16. The system of claim 1 further comprising mode-matching optics to spatially match the light emitted from the laser gain medium to the external resonant cavity.

17. The system of claim 1 wherein the second reflector is deposited directly on a facet of the gain medium.

18. The system of claim 1 further comprising at least one additional gain medium and at least one additional reflector to effect additional light input into the external resonant cavity.

19. A laser system comprising:

(a) an optically nonlinear laser gain medium;

(b) a first reflector having a reflectivity ($R_1$) and a second reflector spaced from the first reflector to define a laser cavity containing the laser gain medium, the second reflector having a reflectivity ($R_2$) larger than the reflectivity ($R_1$) of the first reflector;

(c) a third reflector having a reflectivity ($R_3$) larger than the reflectivity of the first reflector ($R_1$) and defining with the second reflector a resonant cavity external to the laser cavity, said reflectivities of said reflectors resulting in light passing from the laser cavity and resonates in the external resonant cavity and light passing from the external resonant cavity into the laser cavity to passively optically lock said cavities by means of the nonlinearity of the laser gain medium; thereby producing more power in the external cavity than in the laser cavity (d) a means associated with the external resonant cavity for exposing an analytical sample to light energy from the external resonant cavity to result in light interaction characteristic of an analyte in the analytical sample; and (e) a detector positioned adjacent to the means for exposing to detect the light interaction;

such that the laser system detects the presence of the analyte in the analytical sample by changes in the light interaction detected by the detector.

20. A method for passively locking a laser gain medium, comprising:

(a) emitting a light beam from the laser gain medium disposed in a laser cavity defined by a first reflector and a second reflector spaced from the first reflector, said laser gain medium having optical nonlinearity, said first reflector having a reflectivity ($R_1$), said second reflector having a reflectivity ($R_2$); and (b) transmitting light from the laser cavity to a resonant cavity defined by the second reflector and a third reflector, the resonant cavity being external to the laser cavity and said third reflector having a reflectivity ($R_3$), said reflectivities resulting in light emitted from the laser gain medium resonating in the external resonant cavity, part of the light in the external resonant cavity being transmitted back to the laser cavity to passively optically lock said cavities by means of the nonlinearity of the laser gain medium to a resonant frequency of the external resonant cavity; such that more power is achieved in the resonant cavity than in the laser cavity.

21. The method of claim 20, wherein the first reflector has a reflectivity ($R_1$), the second reflector has a reflectivity ($R_2$) larger than the reflectivity ($R_1$) of the first reflector, and the third reflector has a reflectivity ($R_3$) larger than the reflectivity of the first reflector ($R_1$) such that light resonates in the external resonant cavity to build up power therein to one or more orders of magnitude larger than the light in the laser cavity.

22. A method of making an optically looked laser system, comprising:

(a) positioning a first reflector having a reflectivity ($R_1$) a distance away from a second reflector to form a laser cavity, the second reflector having a reflectivity ($R_2$) larger than the reflectivity ($R_1$) of the first reflector;

(b) positioning an optically nonlinear laser gain medium in the laser cavity; and (c) forming an external resonant cavity by positioning a third reflector spaced from the second reflector and external to the laser cavity, the third reflector having a reflectivity ($R_3$) larger than the reflectivity of the first reflector ($R_1$), such that light emitted from the laser gain medium can enter and resonate in the external resonant cavity between the second reflector and the third reflector and such that part of the light resonating in the external resonant cavity can reenter the laser cavity from the external resonant cavity to passively optically lock the two cavities by means of the nonlinearity of the laser gain medium to a resonant frequency of the external resonant cavity by optical feedback; thereby producing more power in the external cavity than in the laser cavity.

* * * * *